(12) United States Patent
Frosien

(10) Patent No.: US 8,445,846 B2
(45) Date of Patent: May 21, 2013

(54) BEAM OPTICAL COMPONENT HAVING A CHARGED PARTICLE LENS

(75) Inventor: Juergen Frosien, Riemerling (DE)

(73) Assignee: ICT Integrated Circuit Testing Gesellschaft fur Halbleiterpruftechnik mbH, Heimstetten (DE)

(*) Notice: Subject to any disclaimer, the term of this patent is extended or adjusted under 35 U.S.C. 154(b) by 873 days.

(21) Appl. No.: 10/587,105

(22) PCT Filed: Dec. 13, 2004

(86) PCT No.: PCT/EP2004/014180
§ 371 (c)(1),
(2), (4) Date: May 22, 2008

(87) PCT Pub. No.: WO2005/071709
PCT Pub. Date: Aug. 4, 2005

(65) Prior Publication Data
US 2008/0230694 A1    Sep. 25, 2008

(30) Foreign Application Priority Data

Jan. 21, 2004  (EP) .................................... 04001222

(51) Int. Cl.
*G01N 23/00* (2006.01)
*G21K 7/00* (2006.01)

(52) U.S. Cl.
USPC ........ 250/307; 250/398; 250/491.1; 250/397; 250/492.3; 250/505.1; 850/9; 850/10; 850/12; 850/18

(58) Field of Classification Search
USPC .................. 250/307, 398, 491.1, 397, 492.3, 250/505.1; 850/9, 10, 12, 18
See application file for complete search history.

(56) References Cited

U.S. PATENT DOCUMENTS

| 2,581,446 A | 1/1952 | Robinson |
| 3,560,781 A | 2/1971 | Riecke |

(Continued)

FOREIGN PATENT DOCUMENTS

| DE | 904096 | 9/1952 |
| DE | 898044 | 10/1952 |

(Continued)

OTHER PUBLICATIONS

Office Action dated Jul. 6, 2009 for Japanese Patent Application No. 2006-549907.

(Continued)

*Primary Examiner* — Jack Berman
*Assistant Examiner* — Meenakshi Sahu
(74) *Attorney, Agent, or Firm* — Patterson & Sheridan, L.L.P.

(57) ABSTRACT

The present invention relates to a beam optical component including a charged particle lens for focusing a charged particle beam, the charged particle lens comprising a first element having a first opening for focusing the charged particle beam; a second element having a second opening for focusing the charged particle beam and first driving means connected with at least one of the first element and the second element for aligning the first opening with respect to the second opening. With the first driving means, the first opening and the second opening can be aligned with respect to each other during beam operation to provide a superior alignment of the beam optical component for a better beam focusing. The present invention also relates to a charged particle beam device that uses said beam optical component for focusing the charged particle beam, and a method to align first opening and second opening with respect to each other.

41 Claims, 11 Drawing Sheets

U.S. PATENT DOCUMENTS

| | | | |
|---|---|---|---|
| 3,714,422 A * | 1/1973 | Hosoki et al. | 850/8 |
| 5,258,617 A | 11/1993 | Kaneyama et al. | |
| 6,194,730 B1 | 2/2001 | Chalupka et al. | |
| 6,534,766 B2 * | 3/2003 | Abe et al. | 250/307 |
| 6,590,210 B1 * | 7/2003 | Essers | 850/9 |
| 7,675,042 B2 * | 3/2010 | Frosien | 250/396 R |

FOREIGN PATENT DOCUMENTS

| | | |
|---|---|---|
| DE | 767861 | 12/1953 |
| EP | 0 883 157 | 12/1998 |
| EP | 1302971 A2 | 4/2003 |
| FR | 2046821 | 6/1970 |
| JP | 1012176 A | 1/1989 |
| JP | 2158042 A | 6/1990 |
| JP | 06 151289 | 5/1994 |
| JP | 8138599 A | 5/1996 |
| JP | 2000-149850 | 5/2000 |
| JP | 2001-345260 | 12/2001 |
| JP | 2002507045 | 3/2002 |
| JP | 2002216686 A | 8/2002 |
| WO | 03 107375 | 12/2003 |

OTHER PUBLICATIONS

Office Action dated Nov. 22, 2010 for Japanese Patent Application No. 2006-549907. (ZIMR/0042).

European Search Report for European Patent Application No. 04001222 dated May 6, 2004.

* cited by examiner

BEAM OPTICAL COMPONENT HAVING A CHARGED PARTICLE LENS

FIELD OF THE INVENTION

The invention relates to a beam optical component having a charged particle lens for focussing a charged particle beam. The invention also relates to a charged particle beam device including said beam optical component and a method for aligning said beam optical component.

BACKGROUND OF THE INVENTION

Improvements of charged particle beam devices, like electron microscopes, electron or ion beam inspection or pattern generating tools, e.g. focused ion beam devices (FIB), depend on further improvements of their beam optical components. Beam optical components include, for example, electrostatic or magnetic charged particle lenses, deflectors, beam apertures, charged particle beam sources and the like.

Charged particle lenses require a high degree of mechanical precision in order to obtain a focus spot of the smallest possible size, which is a prerequisite for obtaining the highest possible spatial resolution when inspecting or structuring a specimen. High precision focussed charged particle beams are used in charged particle beam devices like electron microscopes, pattern generators for lithographic processes in the semiconductor industry or focused ion beam devices (FIB).

Charged particle lenses usually use electrostatic or magnetic fields for focussing the charged particle beam. Charged particle lenses with electrostatic fields are usually composed of two or more electrodes that each have an opening through which the charged particle beam can pass. By applying appropriate voltages to the respective electrodes, the geometric shape of the electrodes and the electric potentials provide for an electrostatic field that can be used to focus an incoming charged particle beam.

Charged particle lenses with magnetic fields, in contrast, are composed of two pole pieces with openings through which the charged particle beam can pass. By providing an appropriate magnetic flux to the respective pole pieces, the geometric shape of the pole pieces and the magnetic flux determine a magnetic field that can be used to focus an incoming charged particle beam.

For a high focussing quality, it is important that the openings of the multiple electrodes or pole pieces are well aligned with respect to each other and with respect to the charged particle beam axis. For example, in order to obtain an electron or ion beam focus of a size smaller than 100 nm, the openings of the electrodes (or pole shoes) need to be aligned with respect to each other with a precision on a micrometer scale. Further, the smaller the openings, the smaller the alignment tolerances are.

A method for producing charged particle lenses with a high alignment precision is disclosed, e.g. by S. Planck and R. Spehr in "*Construction and fabrication of electrostatic field lenses for the SMART project*" in the Annual Report 1996/1997 of "Licht- und Teilchenoptik", Institut für angewandte Physik, Technische Unversität Darmstadt, Prof. Dr. Theo Tschudi on page 114. S. Planck and R. Spehr use insulating precision spheres between electrodes to position the openings of the electrodes with respect to each other. However, for further progress in the focussing of charged particle beams, the alignment of the openings to each other and to the charged particle beam is often not sufficient.

SUMMARY OF THE INVENTION

It is therefore a first aspect of the present invention to provide a beam optical component that is capable of significantly focussing a charged particle beam.

It is a further aspect of the present invention to provide a beam optical component that reduces beam optical aberrations due to misalignments of its elements to improve spatial resolution.

It is yet a further aspect of the present invention to provide a method that facilitates an easy and precise alignment of the beam optical component.

It is a further aspect of the present invention to provide a charged particle beam device that is capable of inspecting or structuring a specimen at the highest spatial resolution possible and, at the same time, provides a high flexibility for different applications.

These and other advantages are achieved by the beam optical components according to claim 1, the charged particle beam device according to claim 34 and the method according to claim 39.

Further advantages, features, aspects, and details of the invention are evident from the dependent claims, the description and the accompanying drawings. The claims are intended to be understood as a first non-limiting approach of defining the invention in general terms.

The beam optical component according to claim 1 includes a charged particle lens whereby the charged particle lens includes a first element having a first opening, a second element having a second opening, and first driving means coupled to at least one out of the first element and the second element for aligning the first opening with respect to the second opening.

With the first driving means, it is possible to align the first opening with respect to the second opening during the operation of the inspecting or structuring charged particle beam. It is also possible to align at least one of the first and second openings to a common symmetry axis during the operation of the inspecting or structuring charged particle beam. This way, the alignment can be carried out while observing the effects of alignment adjustments on images of a specimen generated by the charged particle beam. Such alignment can be carried out iteratively to a precision which can be made much higher than the alignment of charged particle lenses whose opening positions have been fixed during the manufacturing of the lens. Further, with the first driving means, it is possible to compensate for geometrical inaccuracies of the charged particle lens that are unavoidable when fabricating beam optical components.

The improved alignment leads to reduced aberrational distortions of the beam. Further, the higher the alignment precision, the smaller the openings of the electrodes can be at a given alignment error budget. Further, a superior alignment precision opens up the possibility to use such small first, second and/or third openings that at least one of them can be used as a beam aperture. This way, additional beam aperture elements can be omitted which simplifies the operation of the charged particle beam.

In a first preferred embodiment of the invention, first and/or second elements are respective first and/or second pole pieces. In this case, the charged particle lens focuses the charged particle beam by means of a magnetic field.

In a second preferred embodiment of the invention, first and/or second elements are respective first and/or second electrodes. In this case, the charged particle lens focuses the charged particle beam by means of an electrostatic field. Further, in this case, it is preferred that the charged particle lens of the beam optical component includes a third element having a third opening for focussing the charged particle beam. This way, the beam optical component can be used as an Einzel-lens that minimizes interfering electric fields in regions outside the lens.

Einzel-lenses are characterized by three electrodes where the outer two electrodes are at the same voltage (V1=V3). In this case, the focussing properties of an Einzel-lens are defined by the voltage difference between the middle electrode, which is at a second voltage V2, and the outer two electrodes which are at respective first and third voltages V1, V3. If the difference V2-V3 is positive, the Einzel-lens accelerates an incoming negatively charged particle beam made of, e.g., electrons. In this case, the Einzel-lens is also known as Accel-lens. If the difference V2-V3 is negative, the Einzel-lens decelerates an incoming negatively charged particle beam made of electrons. In this case, the Einzel-lens is also known as Decel-lens. However, the present application also applies to charged particle lenses where the first and third voltages V1, V3 of the outer two electrodes are not the same. In this case, the charged particle lens is known as immersion-lens.

Preferably, the beam optical component is capable of aligning first and second elements to a common symmetry axis. In this case, for example, the first driving means may be capable of moving the first element with respect to the second element to the point where the first element is parallel to the second element and where the first opening has the same symmetry axis as the second opening. Such alignment improves the focussing quality of a charged particle beam. Preferably, the alignment of first, second and/or third electrodes includes moving the first, second and/or third electrodes to be parallel to each other.

In a further preferred embodiment, the charged particle lens includes second driving means connected with at least one of the second element and the third element for aligning the second opening with respect to the third opening. In this case, first, second and third elements can be aligned in-situ independently from each other to provide for a best possible focussing.

Preferably, the beam optical component includes a charged particle beam source. In this case, one of the first, second and third elements can be positioned to serve as an extracting electrode. Since such a design makes a separate extracting electrode obsolete, the number of electrodes that need to be aligned with respect to each other is reduced. Further, with the first and/or second driving means, the openings of the first, second and/or third electrodes can be aligned in-situ with respect to the charged particle beam source. This way, alignment errors can be eliminated from the beginning.

In a further preferred embodiment, first, second and/or third elements are shaped and positioned with respect to the charged particle beam source to serve as a beam aperture for the charged particle beam. In this case, first and/or second driving means can be used to align both the beam aperture and the charged particle lens in one. This further reduces the number of elements that need to be aligned, thereby further reducing beam optical defects due to misalignment. Further, with the first, second and/or third elements acting as beam apertures near the charged particle beam source, the charged particle beam current can be adjusted to the required current early on which helps to reduce beam spread due to high current densities (Boersch-Effect).

It is further preferred that the charged particle lens includes first, second and/or third measuring means to measure the locations of the respective first and/or second openings with respect to the second and/or third openings. This way, by feeding the information of the measured locations of the first and/or second measuring means back to the respective first and/or second driving means, the precision for aligning the first, second and/or third elements to each other can be drastically improved.

In one embodiment, the first, second and/or third openings are rotationally symmetric, i.e. circular. In this case the beam optical component acts as a round lens.

In another embodiment, the first, second and/or third openings are rectangular. In this case, the beam optical component acts as a cylinder lens.

According to other embodiments of the invention, at least one of the first, second and/or third elements includes at least two openings. In this case, the first and/or second driving means can be used to replace one opening of a given element by another opening of the same element in-situ. If the two openings have a different size or geometry, an exchange of the openings can be used to provide for another beam aperture and/or another focussing lens. Therefore, providing at least one of the first, second and/or third elements with multiple openings opens up the possibility to in-situ adjust the optical behavior of the beam optical component according to the needs of a given application. Of course, it may also be possible that the third electrode, or one of the more than three electrodes of the charged particle lens, includes at least two openings. This way it is possible that the various openings of the first, second and third electrodes can be freely combined to provide for a large set of different beam optical lenses and aperture angles.

For example, replacing a small opening of a given first or second element by a large opening can be used to increase the beam current but decrease the spatial resolution. On the other hand, replacing a large opening of a given first or second element by a small opening can be used to decrease the beam current but increase the spatial resolution and/or change the focussing.

Further, it is preferred that at least two openings of the multiple openings of at least one of the first, second and/or third electrodes have the same size and geometry. This way, an opening that has been deformed due to extensive exposure to the charged particle beam while serving as a beam aperture, can be replaced by another opening of the same size and geometry in-situ without changing the beam optics. This method effectively enables an in-situ beam aperture replacement that saves time since the vacuum does not need to be broken for the replacement. Of course, the more openings of the same size and geometry an electrode has, the more beam aperture replacements are possible without having to break the vacuum.

The present invention is also directed to a charged particle beam device for focussing a charged particle beam onto a specimen including a beam optical component according to the claims 1-33. The charged particle beam device may be used to focus an electron beam, an ion beam or any other charged particle beam. It may be, e.g., an electron microscope, an electron or ion beam inspection or pattern generating tool, or a focussed ion beam device (FIB).

In a first preferred embodiment, the beam optical component may be used as an objective lens to focus the charged particle beam onto the specimen. With the first and/or second driving means, the objective lens can be precisely aligned to the charged particle beam while imaging a specimen which makes an alignment easier and more precise.

In a second preferred embodiment, the beam optical component is positioned between the objective lens of the charged particle beam device and the charged particle beam source of the charged particle beam device. In this case, the beam optical component may be used as a beam aperture and/or as a condenser to define the beam current and spatial resolution of the charged particle beam device. Further, if the beam optical component is used as a condenser, it is preferred that the condenser is part of the charged particle beam source.

In another preferred embodiment, first or second driving means are rigidly connected to at least two of the first, second and third electrodes. In this case, only one of the driving means can be used to align the openings of at least two electrodes to a common symmetry axis (beam axis).

The present invention also includes the method according to claim 38. With the method, it is possible to align and adjust the beam optical component in-situ to optimize the focus of the charged particle beam for a given application. Further, if at least one of the first, second and third elements is positioned and shaped to act as a beam aperture, the beam aperture can be aligned in-situ to optimize the aperture angle of the charged particle beam.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1A:
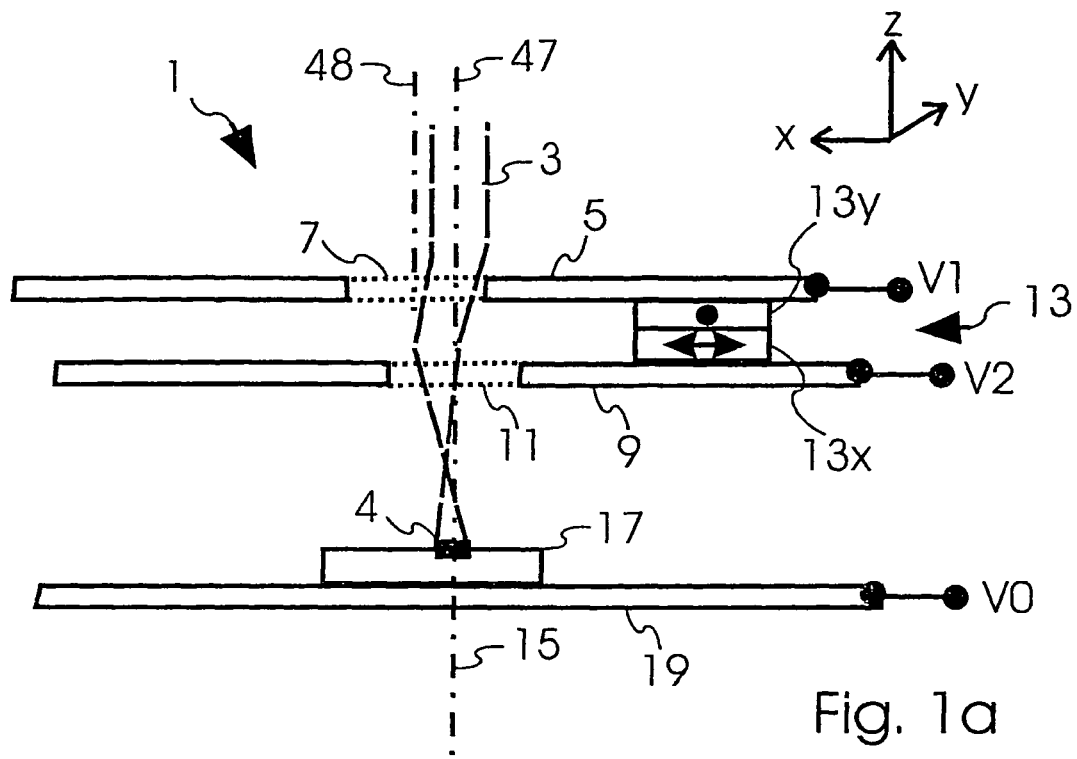
FIG. 1a-b A first beam optical component according to the invention including a charged particle lens with the first and second elements being electrodes, whereby the openings of the respective electrodes are (a) misaligned and (b) aligned.

The beam optical component according to the invention includes a charged particle lens for focussing a charged particle beam. It may be used in charged particle beam devices like a charged particle beam microscope to probe a specimen, e.g. a scanning electron microscope (SEM), a transmission electron microscope (TEM), a scanning transmission microscope (STEM), or a device that uses the charged particle beams to structure a specimen like, e.g., an electron beam pattern generator to structure a lithographic mask. Further, the beam optical component may also be used in focused ion beam devices (FIBs) to slice, mill or inspect a specimen.

If the charged particle lens of the beam optical component is a magnetic lens, the first and/or second elements are preferably first and/or second pole pieces having respective first and/or second openings. If the charged particle lens of the beam optical component is an electrostatic lens, the first, second and/or third elements are preferably first second and/or third electrodes having respective first second and/or third openings.

The present invention is largely independent of the kind of driving means used for the first, second and or third driving means. Generally, the choice of driving means depends on the aspired spatial resolution of the charged particle beam device, on the charged particle beam energy, on the beam currents, the size of the specimen, and other parameters. Those parameters in turn define the required alignment precision, the required vacuum capability, the permitted electromagnetic interference with the charged particle beam and the like, with which the driving means must comply.

Typically, the driving means of the present invention are remotely controllable in order to be able to carry out the alignment without breaking the vacuum within which the charged particle beam is operated. This way, the alignment can be carried out in-situ, i.e. during beam operation. This in turn makes it possible that the alignment is iteratively carried out based on images of a specimen obtained for each alignment position. This way, an alignment of the first, second and/or third openings with respect to each other with a precision of better than 1 micrometer and preferably better than 100 mm is possible. Such an alignment is generally more precise than an alignment carried out during fabrication of the charged particle lens.

Further, typically, the first and/or second driving means are rigidly connected with at least one of the respective first, second and/or third elements. This way, the driving means fully define the spatial positions of the respective openings.

Further, typically, the driving means are electrically controllable. In this case, the driving means may be stepping motors, piezo-drives, DC-motors or other means. For applications that require a focussing spot size of less than a micrometer, it is preferred that the driving means are capable of moving the electrodes and/or pole pieces with respect to each other at a spatial resolution which is in the sub-micron range, preferably below 100 nm and even more preferred below 20 nm.

Generally, for a very high alignment precision, piezo-drives are the preferred means for aligning the first, second and/or third openings to each other. Typically, commercially available piezo-drives are taken that are capable of providing a positioning accuracy of less than 20 nm for each of the three axes (x-y-z-axes), that may provide a travel distance of up to 200 mm and more, that are ultra high vacuum compatible, and that keep the magnetic interference to the charged particle beam at a level of less than 500 nano Tesla. Such piezo-drives may be installed directly to the respective electrode or pole piece within the vacuum chamber.

To obtain a superior spatial resolution, piezo-drives may have encoders that measure the actual location of the respective first and/or second openings with respect to the second and/or third openings. Then, the information of the measured locations is fed to the respective driving means to adjust the actual position to the desired locations. Even more preferred, driving means and measuring means are contained within one unit, e.g. DC-motor and encoder, or piezo-drive and encoder.

The following figures disclose several embodiments according to the invention. They represent only non-limiting examples. Therefore, it is clear to a person skilled in the art that it is well within the scope of the invention to combine the features of the embodiments in various ways.

Figure 1B:
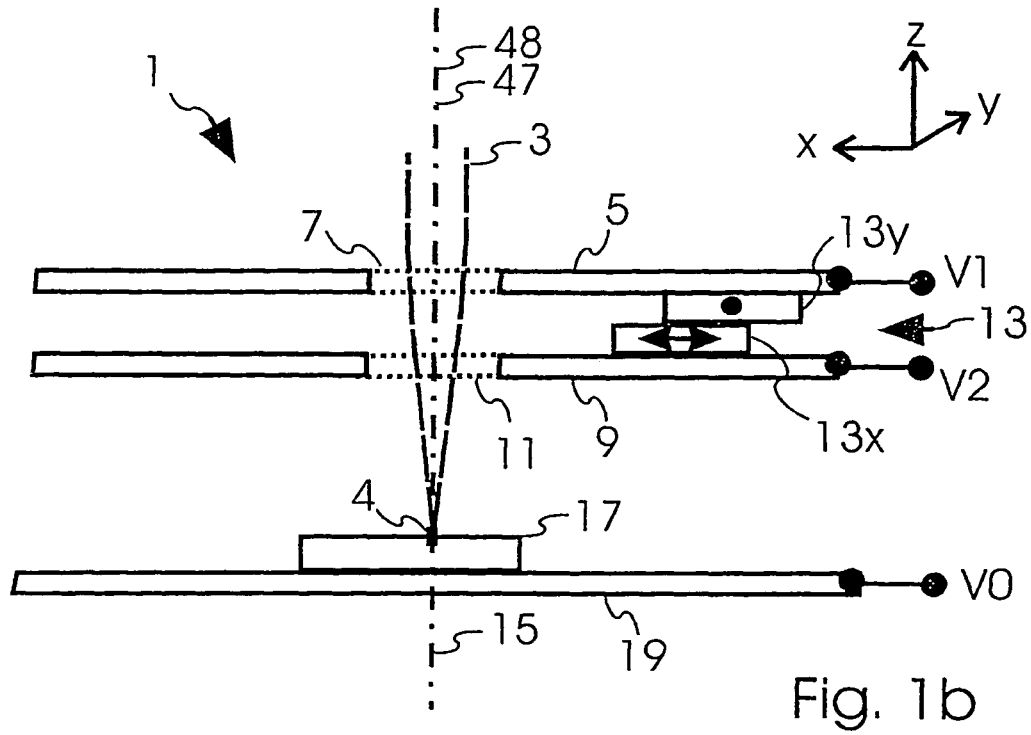

FIGS. 1a-b depict a beam optical component according to the invention having an electrostatic charged particle lens 1 at two different aligning states. Charged particle lens 1 includes a first electrode 5 having a first opening 7 and a second electrode 9 having a second opening 11 to focus the charged particle beam 3 onto a specimen 17. The charged particle lens 1 of FIGS. 1a-b serves as an objective lens to focus the charged particle beam 3 onto a specimen 17.

In the design of FIG. 1a-b, specimen voltage V0 connected with a specimen holder 19, first voltage V1 connected with the first electrode 5 and second voltage V2 connected with the second electrode 9, and shape and positions of the first and second openings 7, 11, define the shape of the electric field that focuses the charged particle beam 3. In FIG. 1a-b, first and second openings 7, 11 are circular in order to provide a highly rotationally symmetric focussing electric field. A highly rotationally symmetric field usually provides for the smallest focussing spot size. The values of the first and second voltages V1, V2, and the value of the specimen voltage V0, depend strongly on the application. However, a person skilled in the art knows which values to choose for a given application.

In FIG. 1a, the first opening 7 is not aligned with respect to the second opening 11, i.e. the first central axis 47 of the first opening 7 is not aligned with the second central axis 48 of the second opening 11. In this case, the rotational symmetry of the electrostatic focussing lens 1 with respect to the symmetry axis 15 is distorted. Accordingly, the charged particle beam 3 becomes distorted while passing through the first and second openings 7, 11 and, as a consequence, the focus spot size 4 of the charged particle beam 3 on specimen 17 is increased and off-axis. Such misalignment deteriorates the spatial resolution of a charged particle beam device that uses such charged particle lens 1.

In order to correct the misalignment, first driving means 13 move first electrode 5 laterally with respect to the second electrode 9 until first opening 7 is aligned with respect to the second opening 11, as shown in FIG. 1b. In FIG. 1b, first and second openings 7, 11, i.e. first and second central axes 47, 48, are aligned to common symmetry axis 15. Further, common symmetry axis 15 is aligned to the axis of the charged particle beam 3. In this case, the focussing electric field is rotationally symmetric with respect to the charged particle beam 3 which provides for a focus which is on-axis and has a minimum focus spot size 4 on the specimen.

In FIG. 1a-b, driving means 13 are included of an x-drive 13x that is capable of moving the first electrode into the x-direction laterally to the beam direction (z-direction), and a y-drive 13y that is capable of moving the first electrode into the y-direction laterally to the beam direction and perpendicular to the x-direction. The independent movements of the two drives provide that the first electrode 5 can be moved into any lateral direction within the respective maximum moving ranges of the two drives. As can be seen in FIG. 1b, the first electrode 5 has been shifted to the right in order to correct the misalignment of the first and second openings 7, 11.

In FIGS. 1a-b, first driving means 13 are rigidly connected to the first and the second electrodes 5, 9. However, it is obvious to a person skilled in the art that the alignment of the two electrodes 5, 9 can also be achieved where the first driving means 13 is connected to the first electrode 5, but not to the second electrode 9. In this case, first driving means 13 is connected on one side with the first electrode 5 and on the other side with some other structure that is fixed, e.g. with respect to a beam column or specimen holder 19.

If the driving means 13 in FIGS. 1a-b are made of a material that tends to outgas in vacuum, it is difficult to maintain a high quality vacuum that is usually required for operating a charged particle beam. In this case, it is preferred that there is a flexible vacuum wall between the driving means and the respective electrode or pole piece. With a flexible vacuum wall, the driving means can be operated in a normal atmospheric environment while the respective elements (i.e. electrode or pole piece) can be operated in a vacuum. In this case, aligning a first opening with respect to a second opening may be carried out by making the driving means move the flexible vacuum wall, which in turn makes the respective electrode or pole piece move. Often, flexible vacuum walls are realized as bellows made of steel or other vacuum compatible materials. A person skilled in the art knows how to setup a system where an electrode or pole piece within a vacuum chamber is aligned by driving means that are located outside of the vacuum.

Figure 2A:
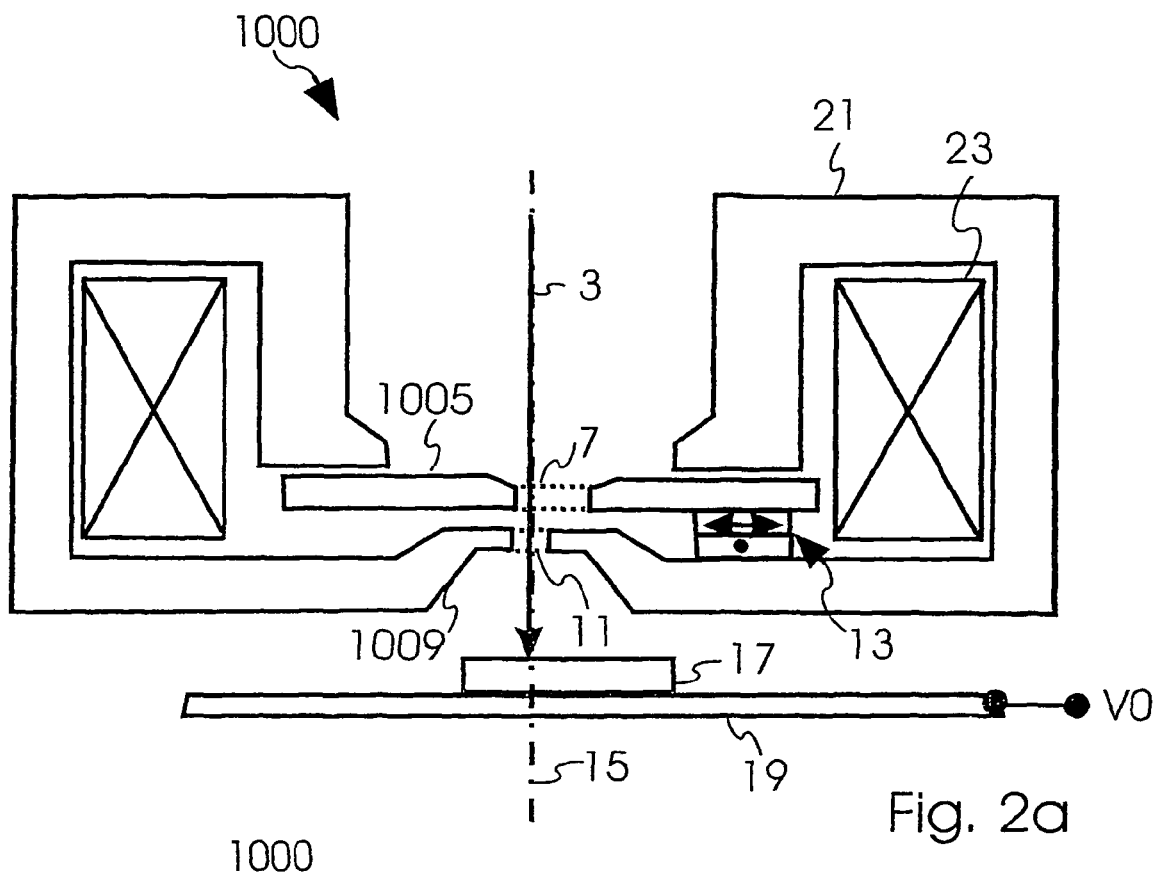
FIGS. 2a-b A second beam optical component according to the invention including a charged particle lens with the first and second elements being pole pieces, whereby the openings of the respective pole pieces are (a) misaligned and (b) aligned.
Figure 2B:
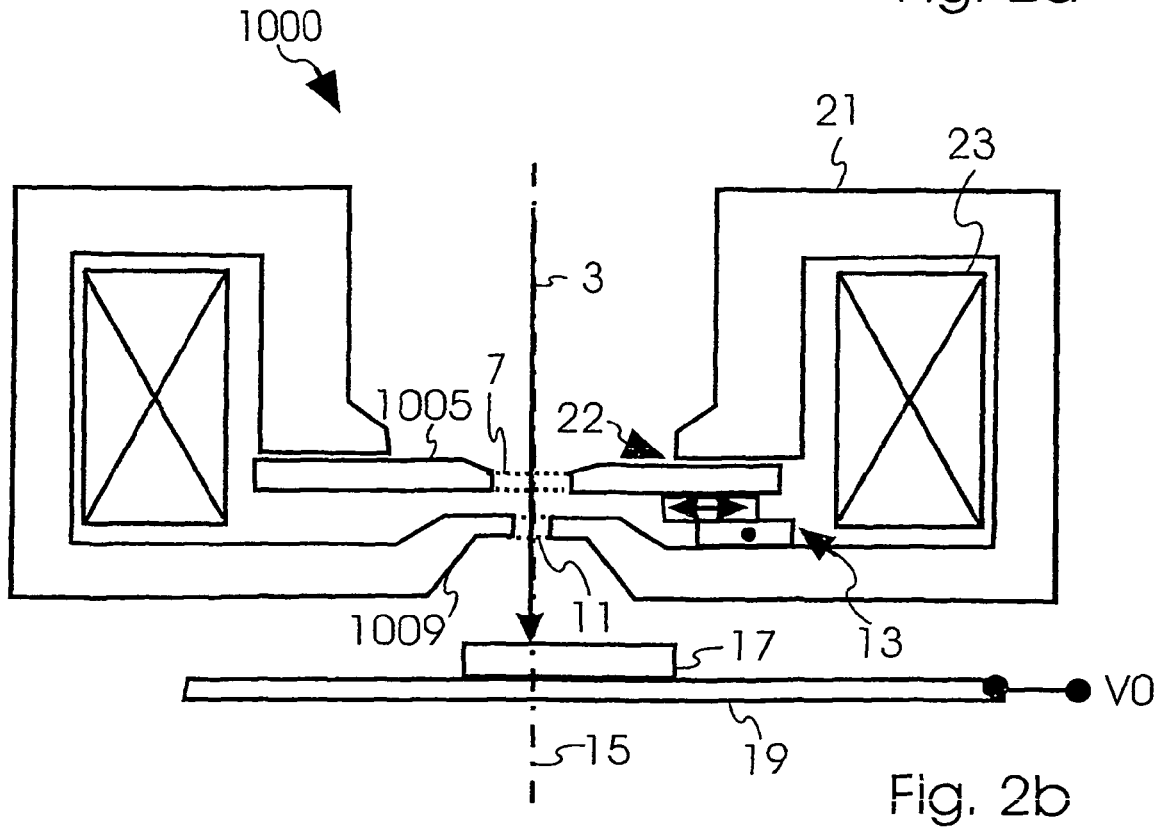

FIGS. 2a-b depict an example where the beam optical component according to the invention includes a magnetic charged particle lens 1000. As for the electrostatic charged particle lens 1, magnetic charged particle lens 1000 of FIGS. 2a-b serves as an objective lens to focus the charged particle beam 3 onto specimen 17. Charged particle lens 1000 is included of a coil 23 being rotationally symmetric with respect to the symmetry axis 15. Coil 23 is surrounded by yoke 21 that concentrates the magnetic flux to provide for a strong rotationally symmetric magnetic field in the region of the charged particle beam 3 between the first element 1005 ("first pole piece") and the second element 1009 ("second pole piece"). Note that, in order for the magnetic flux to arrive at the first pole piece 1005, the magnetic field has to cross air gap 22 between yoke 21 and first pole piece 1005. Air gap 22 allows for a movement of the first pole piece 1005 with respect to the second pole piece 1009 in all directions lateral to the symmetry axis 15. Of course, it is preferred that the air gap 23 is as small as possible in order to minimize the loss of magnetic flux. Air gap 22 may even have no gap distance at all provided that the first pole piece 1005 is kept free to slide below yoke 21.

First driving means 13 of FIG. 2a-b may be the same as described in FIG. 1a-b. They serve to align first opening 7 of first pole piece 1005 with respect to second opening 11 of second pole piece 1009. As in FIG. 1a-b, first driving means 13 may be included of an x-drive 13x and a y-drive 13y to enable the first pole piece 1005 to freely move laterally in x- and in y-directions with respect to the second pole piece 1009.

FIG. 2a illustrates magnetic focussing lens 1000 in a situation where opening 7 of first pole piece 1005 is misaligned with respect to the opening 11 of the second pole piece 1009. In this case, charged particle beam 3 cannot be focussed to the smallest possible focus spot size 4. FIG. 2b illustrates the same magnetic focussing lens 1000 after first driving means 13 have moved first pole piece 1005 to a position where first opening 7 is aligned with respect to second pole piece 1009.

Therefore, with first driving means 13, it is possible to compensate for misalignments of the pole piece openings, e.g. due to fabrication tolerances.

Figure 3:
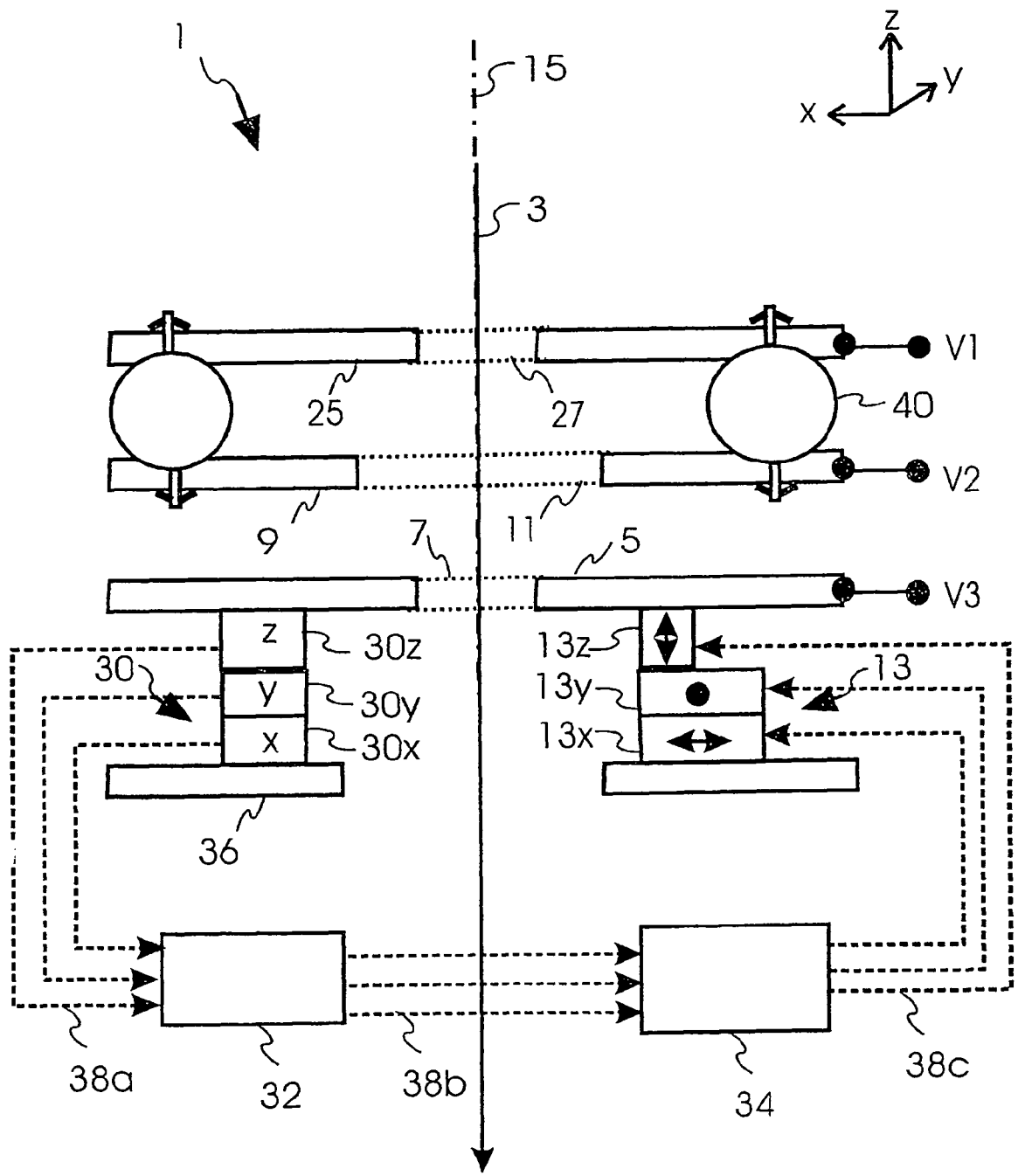
FIG. 3 A third beam optical component according to the invention including a charged particle lens having first, second and third electrodes and first driving means.

FIG. 3 represents a third embodiment according to the invention. FIG. 3 depicts a beam optical component having an electrostatic charged particle lens 1 having first, second and third electrodes 5, 9, 25, each having respective first, second and third openings 7, 11, 27. First electrode 5 is connected to third voltage V3, second electrode 9 is connected to second voltage V2 and third electrode 25 to first voltage V1. For many applications, the outer two electrodes, i.e. first and third electrodes 5, 25, are operated at the same voltage. In this case, the electrostatic field within the lens hardly interferes with regions surrounding charged particle lens 1. In this case, charged particle lens 1 is operated as "Einzel-lens". If first and third voltages V1 and V3 are not the same, charged particle lens 1 is usually referred to as immersion lens.

In the example of FIG. 3, first driving means 13 are used to align first opening 7 of first electrode 5 to second opening 11 and third opening 27. Different from FIG. 1*a-b*, one side of driving means 13 is connected with first electrode 5, while the other side of driving means 13 is connected to a first base plate 36 that is preferably fixed to some structure, e.g. the beam column.

First driving means 13 may be the same as the one shown in FIGS. 1*a-b* or FIGS. 2*a-b* with the difference that in this case, first driving means 13 include two or three z-drives 13*z* to move first electrode 5 at two or three different positions into the z-direction, i.e. into the beam direction (see FIG. 9). Since the three z-drives can be operated independently from each other, it is possible to change the orientation of the central axis 47 (not shown) of the first opening 7 with respect to symmetry axis 15. This way, in addition to the lateral alignment within the x-y plane by x-rive 13*x* and y-drive 13*y*, first electrode 5 can be aligned to be perfectly parallel with respect to second electrode 9 and/or third electrode 25.

Charged particle lens 1 of FIG. 3 also includes first measuring means 30 to measure the actual location of first opening 7. Preferably, measuring means 30 include an x-sensor 30*x* to measure the location within the x-direction, a y-sensor 30*y* to measure the location within the y-direction, and a z-sensor 30*z* to measure the location within the z-direction. The measured values are directed via cable 38*a* to an x-y-z-encoder which turns the measured values into a position, and from there via cable 38*b* to an x-y-z-controller 34 which compares the measured location with the desired location. In the case that the x-y-z-controller 34 determines a difference between the measured and the desired locations, it issues a command via cable 38*c* to x-drive 13*x*, y-drive 13*y* and/or z-drive 13*z* to move the first electrode 5 in a way that eliminates that difference. First measuring means 30, cable 38*a,b,c*, x-y-z-encoder 32, and x-y-z-controller represent a feedback system that helps to drastically improve the alignment precision which, depending on the types of driving or measuring means, can be as good as 500 nm or better.

In FIG. 3, only first electrode 5 is movable by means of a driving means. Second electrode 9 and third electrode 25, in contrast, are aligned with respect to each other by at least three distance pieces 40. Distance pieces 40 are almost perfectly rounded electrically insulating spheres that may have a maximum deviation from a perfect sphere of about 1 or 2 micrometers. The use of such sphere for an alignment of electrodes has been described, for example, in S. Planck and R. Spehr in *"Construction and fabrication of electrostatic field lenses for the SMART project"* in the Annual Report 1996/1997 of "Licht- und Teilchenoptik", Institut für angewandte Physik, Technische Universität Darmstadt, Prof. Dr. Theo Tschudi on page 114, which herewith is enclosed into the description. Due to the very high geometric precision of the spheres, it is possible to align second opening 11 with respect to third opening 27 with a precision of typically 1 micrometer. However, in the design of S. Planck and R. Spehr, the alignment of adjacent electrodes is often hampered by deformations of the electrodes due to the pressure that the screws, which hold the two electrodes together, exert onto the electrodes.

Figure 9A:
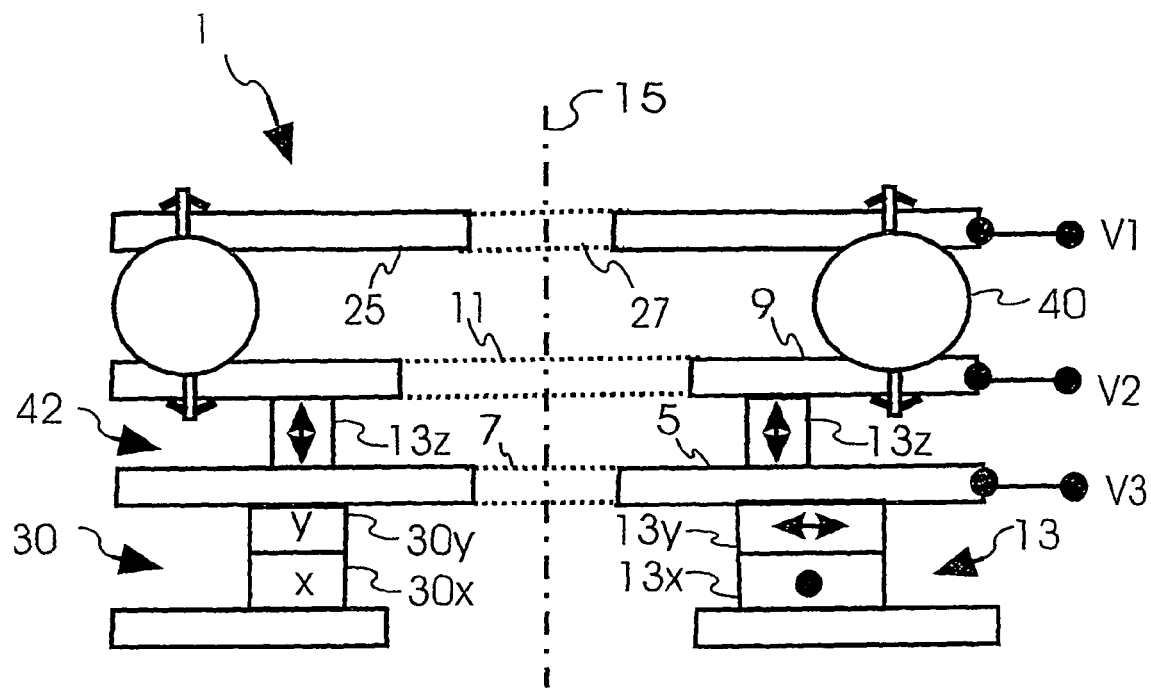
FIG. 9a-b (a) An ninth beam optical component according to the invention including a charged particle lens having three z-drives connected to the first and second electrodes for adjusting the parallelism of the first electrode with respect to the second electrode, and (b) the second electrode of FIG. 9a when seen from above.
Figure 9B:
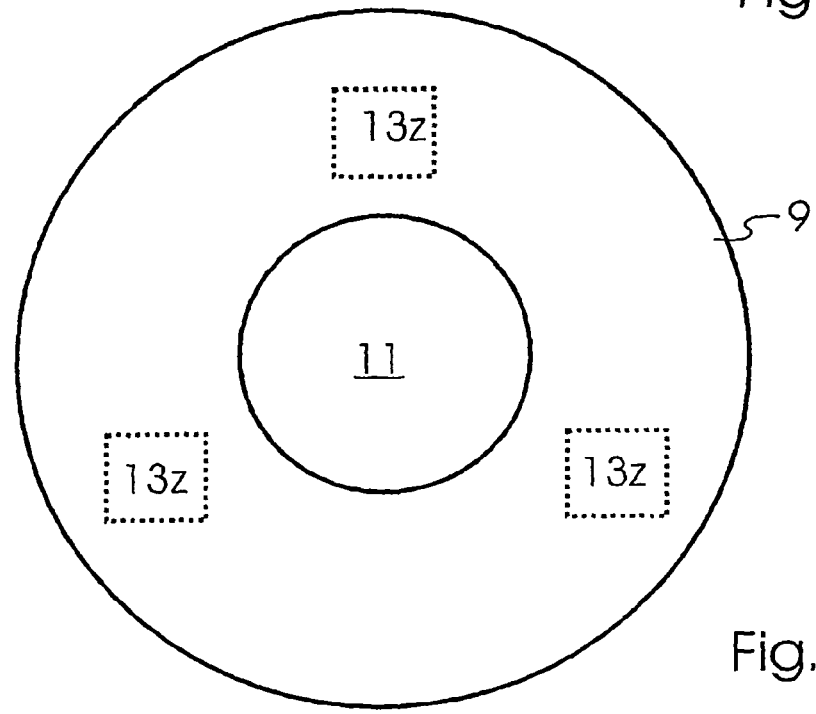

It is therefore a further aspect of the invention that in the designs of FIGS. 3 and 5-7, electrode 9 and third electrode 25 are fastened to the spherical distance pieces 40 by notched pins 57 and springs 53 as indicated in the drawings, and explained in more detail in the description for FIG. 9*a-c*.

Using driving means for only one or two electrodes of the three electrodes 5, 9 and 25 simplifies the setup considerably, compared to a design where every electrode is connected to driving means. Further, for many applications, it is sufficient to align only one or two of the three electrodes, since it is often only one or two electrodes whose alignment is particularly critical for a lens performance. For example, generally, the smaller an opening radius of an electrode, the more critical its alignment is for the focussing performance. Therefore, since for Einzel-lenses the middle electrode usually has the largest opening, driving means often contribute to a better focussing only if the outer electrodes are moved. Further, in the case that one of the outer electrodes is used as a beam aperture for a charged particle beam device, it is often mainly the spatial precision of the opening of that electrode that matters for the focussing quality. Therefore, using driving means for only one electrode may turn out to provide the best balance between an achievable focussing quality and complexity of the beam optical component.

Figure 4:
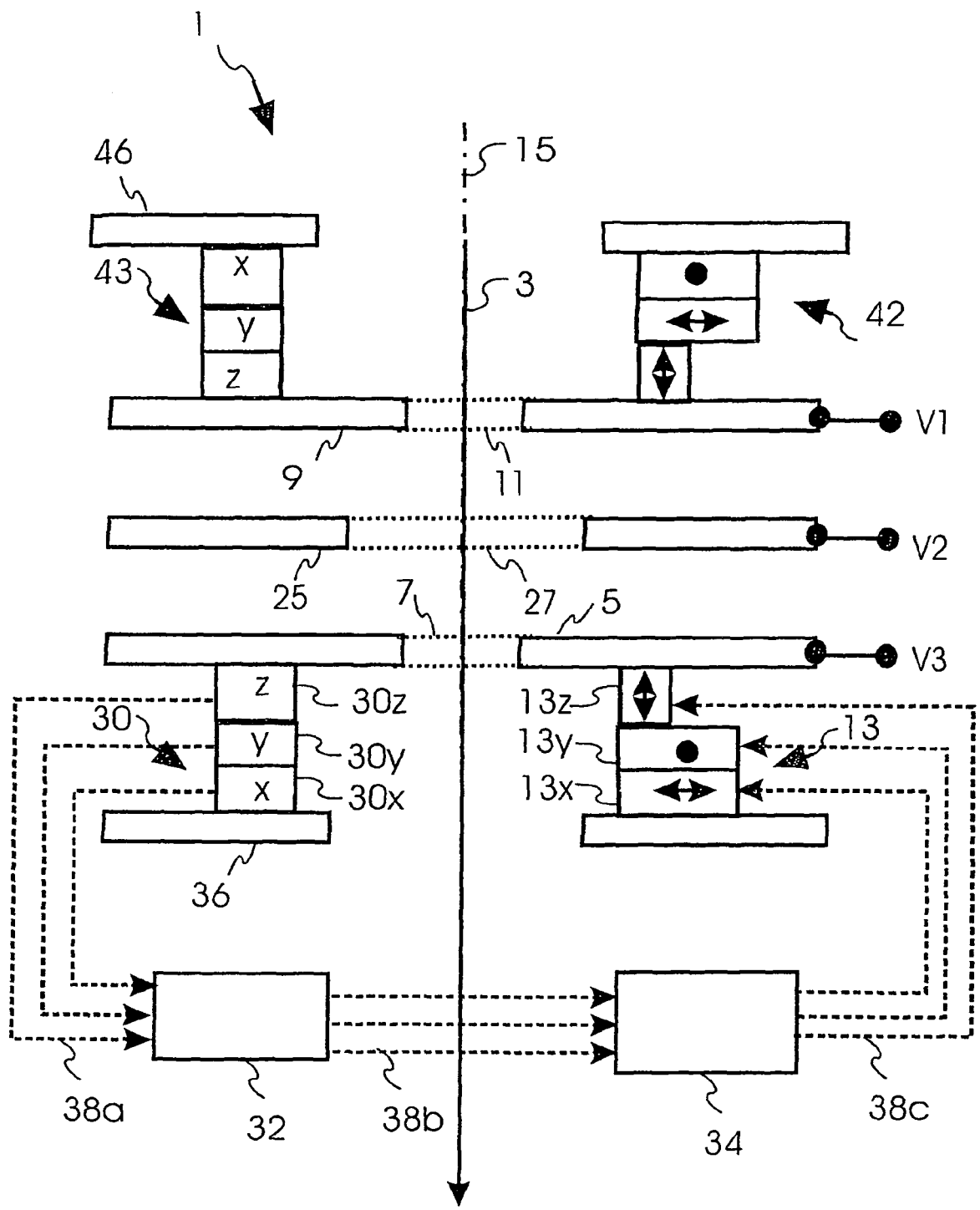
FIG. 4 A fourth beam optical component according to the invention including a charged particle lens having first, second and third electrodes and first and second driving means.

FIG. 4 discloses a fourth embodiment according to the invention. The charged particle lens 1 of the beam optical component of FIG. 4 is the same as the one of FIG. 3, with the difference that it includes second driving means 42 for aligning second opening 11 with respect to the third opening 27 of the third electrode 25. Note that in FIG. 4, second electrode 9 is connected with first voltage V1, third electrode 25 is connected with second voltage V2, and first electrode 5 is connected with third voltage V3. Further, second driving means 42 are connected on one side to second electrode 9 and on the other side to second base plate 46 whose position is fixed with respect to the symmetry axis 15. With first driving means 13 and second driving means 42, first opening 7 and second opening 11 can be aligned to symmetry axis 15 independently. This makes it possible to align the first and second openings 7, 11 independently to the beam axis 3 which usually coincides with the symmetry axis 15. Since the outer electrodes, i.e. first electrode 5 and second electrode 9 of FIG. 4, have the smallest openings, those two need to be particularly well aligned. Generally, for Einzel-lenses, the outer electrodes tend to have smaller openings than the center electrode in order to provide a good shielding of the electrostatic lens field. For example, with an opening diameter of 1 millimeter, an alignment precision of typically better than 1 micrometer is required in order to render alignment errors irrelevant for the focussing. Note that both first and second driving means 13, 42 are equipped with respective first and second measuring means 30, 43 in order to provide for a feed back loop (not shown for second driving means 42) for improving the spatial resolution of first and second driving means.

Figure 5:
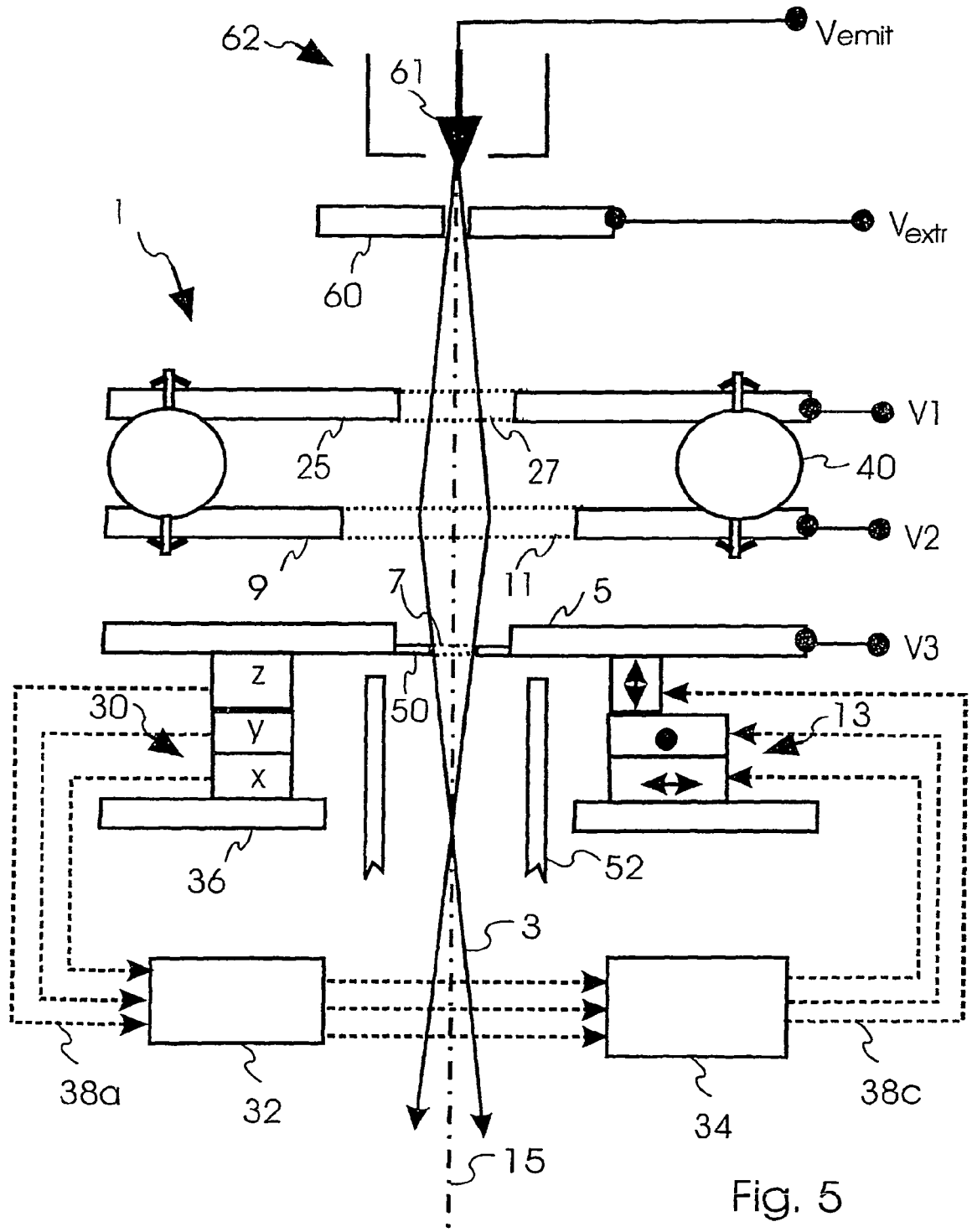
FIG. 5 A fifth beam optical component according to the invention including a charged particle lens and a charged particle beam source.

FIG. 5 discloses a fifth embodiment according to the invention. In FIG. 5, the beam optical component includes an electrostatic charged particle lens 1 of the type as shown in FIG. 3, and a charged particle beam source 62. The charged particle beam source 62 of FIG. 5 is included of an emitter 61 and an extracting electrode 60 to extract charged particles by means of extracting voltage $V_{ext}$ from emitter 61 into a vacuum to form charged particle beam 3. The beam optical component of FIG. 5 represents a compact design of a device that is capable of focussing a charged particle beam.

Note that in FIG. 5, first electrode 5 is shaped and positioned with respect to charged particle beam source 62 to provide that first opening 7 serves as a beam aperture 50. Therefore, in order to minimize scattering of the charged particle beam 3 at the wall of the opening, beam aperture 50 is characterized by a knife-like edge that defines the size of opening 7. With first electrode 5 acting as a lens and as an aperture, the number of beam optical elements that need to be aligned with respect to each other can be reduced. First driving means 13, in this case, serve to align the focussing lens 1 and beam aperture 50 to charged particle beam source 62 at the same time.

Also note that in FIG. 5, liner tube 52 is coaxially aligned with respect to symmetry axis 15. Liner tube 52 may be part of the beam optical component or not. Liner tube 52 is a conducting tube kept at a liner tube voltage (not shown) to provide a field free region within the tube for the charged particle beam 3 while drifting through liner tube 52 towards a specimen. Liner tube 52 protects the charged particle beam 3 from electric distortions generated from all sorts of electronic components that usually are part of a charged particle beam device, including distortions generated by driving means 13 and measuring means 30.

The method for aligning the first opening 7 of first electrode 5 with respect to the second opening 11 of second electrode 9 is preferably carried out by the following steps:

(a) providing a specimen that is to be inspected or structured or inspected by the charged particle beam 3;

(b) scanning the charged particle beam 3 across the specimen 17 to generate a first image of the specimen 17 with a first set of voltages applied to the first element 5 and the second element 9. Preferably, the first image is generated by scanning the charged particle beam 3 across a first region of the specimen and detecting the particles that are generated on the specimen due to the interaction of the charged particle beam with the specimen at any scanned position;

(c) scanning the charged particle beam 3 across the specimen 17 to generate a second image of the specimen 17 with a second set of voltages applied to the first element 5 and the second element 9. Preferably, the operational parameters of the charged particle beam device are the same for the first imaging and the second imaging except for the first set of voltages and the second set of voltages. Preferably, the first and the second set of voltages differ for only one electrode. If the electrostatic focussing lens 1 is included of at least three electrodes, it is preferred that the first set of voltages and the second set of voltages differ only by the voltages of the middle electrode, i.e. the electrode connected to second voltage V2. This is because changes of the second voltage V2 affect the electrostatic fields outside of the electrostatic focussing lens 1 minimally, compared to first and third voltages V1, V3 of the two outer electrodes;

(d) moving the first electrode 5 with respect to the second electrode 9. This movement changes the alignment of the first opening 7 with respect to the second opening 11. The movement is preferably carried out by first driving means 13.

(e) repeating the steps d), e), f), until at least one structure element of the specimen identified in the first image is identified in the second image. This step is based on the recognition that, the more a movement of the first electrode 5 improves the alignment of the first opening 7 with the second opening 11, the more specimen structure elements identified in the first image can also be identified in the second image. A perfect alignment would correspond to the case where the first image is identical with the second image except for the spatial resolution. On the other hand, if a movement of the first electrode 5 worsens the alignment of the first opening 7 with the second opening 11, the less specimen structure elements identified in the first image can be identified in the second image. This is because usually, the larger the misalignment, the more the region scanned during the first imaging deviates from the region scanned during the second imaging;

Preferably, the charged particle beam 3 is generated by switching on the charged particle beam source 62, e.g. by applying a voltage V between emitter 61 and extracting electrode 60 ($V=V_{ext}-V_{emit}$). If the charged particle beam source 62 is a thermal electron beam gun, a thermal field emitter cathode, a liquid metal ion source or any other electron or ion beam source known in the art, the generation of the charged particle beam 3 proceeds accordingly;

When operating the charged particle beam device with a beam optical component having a charged particle lens 1 with three electrodes 5, 9, 25, it is preferred that the first and third voltages V1, V3, which are connected to the outer two electrodes, have the same value (V1=V3). This way, electrostatic interference of the focussing electrostatic field with the accelerating or deflecting fields outside of the electrostatic focussing lens 1 region ("Einzel-lens") is minimized. In this case, the focussing length of electrostatic focussing lens 1 performance is essentially controlled by the second voltage V2, i.e. the voltage of the middle electrode, with respect to the first and third voltage V1, V3.

Further, it is preferred that the liner tube voltage is equal to the third voltage V3, which is the voltage of the electrode closest to the liner tube 52. This way, the electrostatic interference between liner tube 52 and the focussing field defined by the third voltage V3 is minimized.

Figure 6:
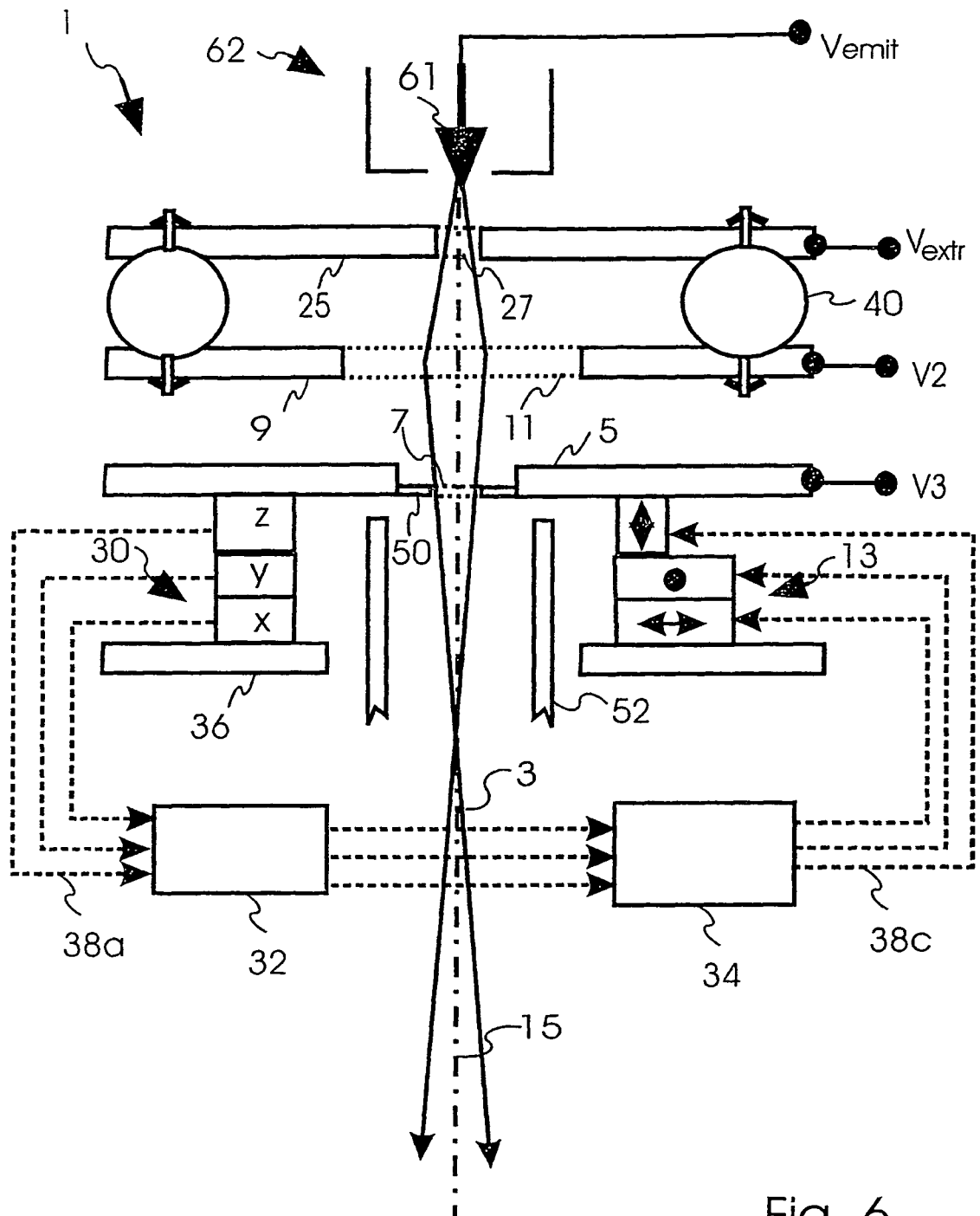
FIG. 6 A sixth beam optical component according to the invention including a charged particle lens and a charged particle beam source, whereby the third electrode of the charged particle lens also serves as extracting electrode.

FIG. 6 discloses a sixth embodiment according to the invention. In FIG. 6, the beam optical component, like in FIG. 5, includes an electrostatic charged particle lens 1 of the type as shown in FIG. 3, and a charged particle beam source 62. However, different from the design of FIG. 5, third electrode 25 of charged particle lens 1 is positioned close to the emitter 61 and connected to the extracting voltage $V_{ext}$ in order to serve both as extracting electrode and as third electrode of focussing lens 1. This further reduces the number of elements that need to be aligned with respect to each other. The design of FIG. 6 therefore provides for a compact beam optical component that helps to minimize beam optical distortions due to misalignments of its elements.

Figure 7A:
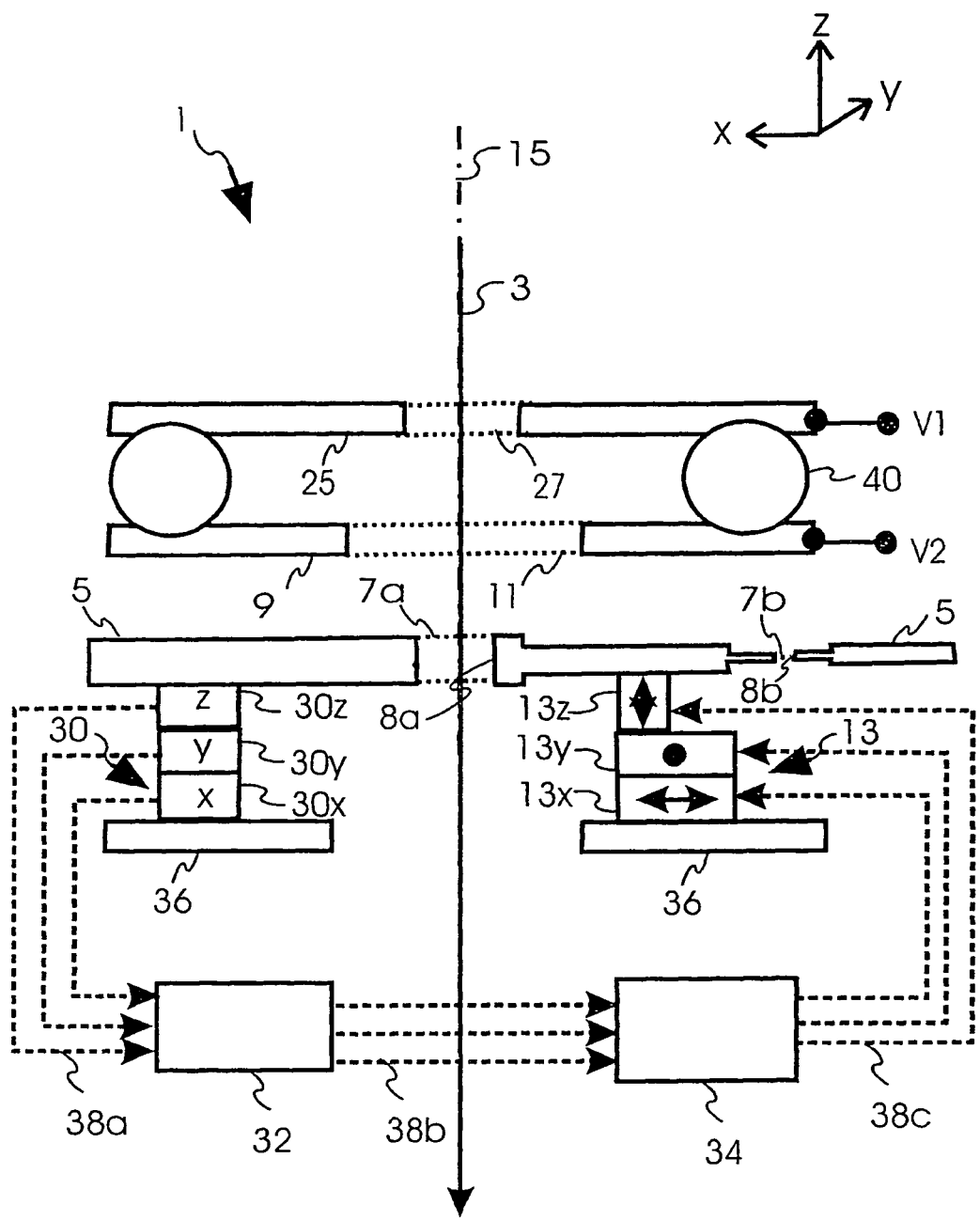
FIG. 7a A seventh beam optical component according to the invention including a charged particle lens having a first electrode with multiple openings and different rim thicknesses.
Figure 7B:
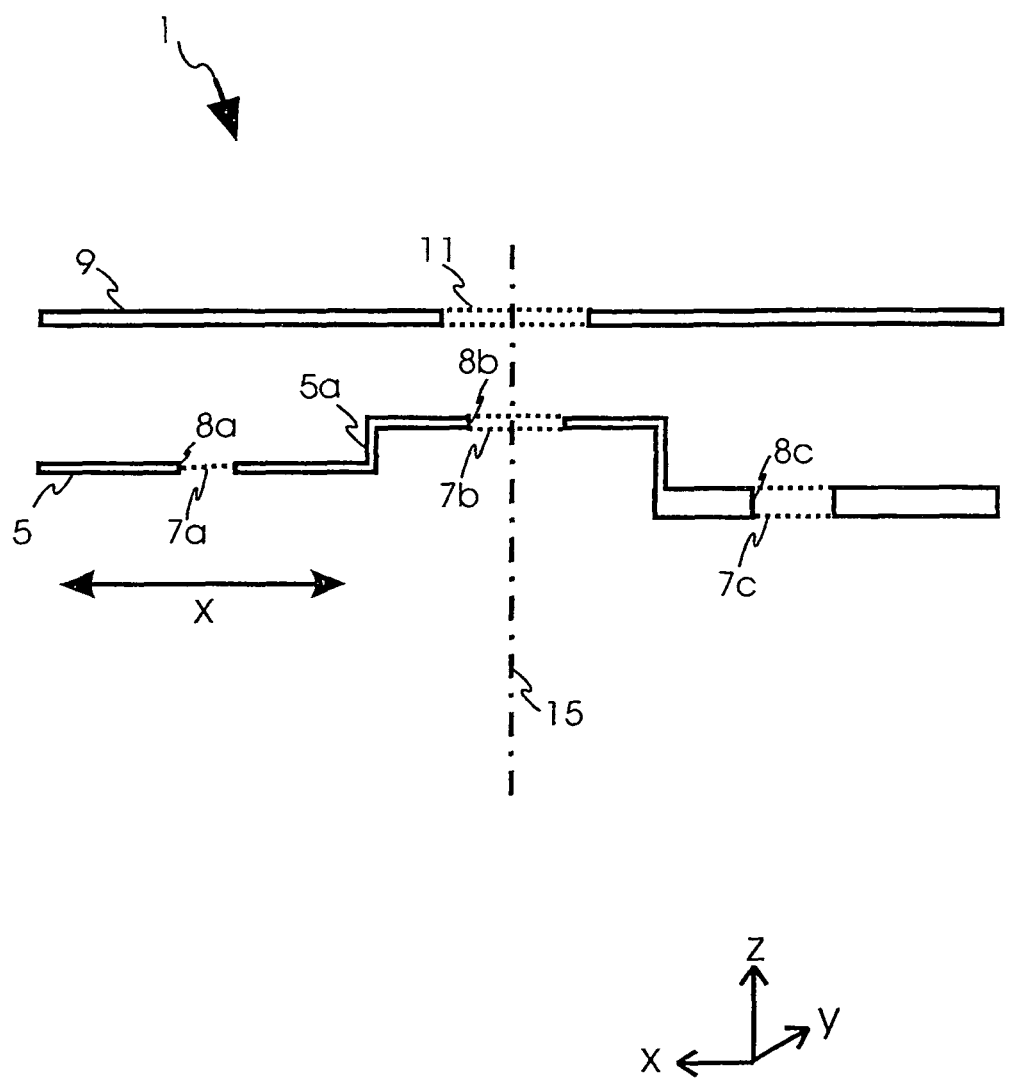
FIG. 7b An eighths beam optical component according to the invention having a first electrode with multiple openings to provide exchangeable rim thickness, exchangeable opening sizes and exchangeable opening distances.

FIGS. 7a-b disclose seventh and an eighths embodiments according to the invention. Both embodiments disclose charged particle lenses 1 that are similar to the design of FIG. 3, but have first electrodes 5 with multiple openings 7a, 7b, 7c. Thus, with first driving means 13 moving first electrodes 5 in x-direction, it is possible to replace an active opening of the first electrode 5 by one of the other openings 7a, 7b, 7c during beam operation. The term "active" refers to the opening that has been moved to be in line with the charged particle beam 3. The replacement is carried out by moving first electrode 5 with respect to the other electrodes until the active opening of first electrode 5 has been moved out of the active position and one of the other openings 7a, 7b, 7c of the electrode has been moved into the active position.

For example, in FIG. 7a, by moving first electrode 5 in x-direction to the left, it is possible to move first opening 7a out of the active position and move second opening 7b into the active position during operation of the charged particle beam. This way, e.g. by replacing an opening 7a having a large size and a thick rim 8a by an opening 7b having a small opening and a thin rim thickness 8b, it is possible to modify the optical properties of the charged particle lens 1 without having to break the vacuum. For example, changing from a large opening 7a to a small opening 7b can be used to change the focussing length and/or to reduce beam aberration, depending on the application. Further, changing from an opening 7a having a thick rim 8a to an opening 7b having a thin rim 8b, can be used to effectively change the principal plane of the charged particle lens 1, which in turn changes the magnification of the beam optical system. This way, a zoom optic can be realized. Preferably, by replacing an active opening 7a, 7b, 7c by another of the multiple openings, the rim thickness 8a, 8b, 8c can be changed by more than a factor of two, preferably by more than a factor four and even more preferred by a factor of 10.

FIG. 7b discloses another charged particle lens 1 that has a movable first electrode 5 with multiple openings 7a, 7b, 7c like in FIG. 7a. However, in FIG. 7b, first electrode 5 includes axially extending element structures 5a to provide that the distance of opening 7b to opening 11 in axial direction is smaller than the distance in axial direction of opening 7c or opening 7a to opening 11 of second electrode 9. This way, by moving opening 7b laterally out of the active position and opening 7c laterally into the active position, not only the thin rim thickness 8b of opening 7b is replaced by thick rim thickness 8c of opening 7c, but also the distances between the respective active openings of the first electrode 5 and the second electrode 9 is changed; for example, by moving first electrode 5 with respect to second electrode laterally to common symmetry axis 15, it is possible to change the distances between active openings of adjacent electrodes without having to use z-driving means 13z. Preferably, the distance between active openings can be changed this way by more than 10 percent, preferably by more than 50 percent, and even more preferred by more than 100 percent.

The shapes of the first electrodes 5 of FIGS. 7a and 7b are only examples for many other ways in which first and/or second electrodes with multiple openings 7a, 7b, 7c can be shaped in order to provide for a more flexible beam optic. Generally, the first and/or second electrodes may have multiple openings that facilitate for an "in-situ" replacement the rim thickness, opening size and/or distance between adjacent openings. The more multiple openings of different geometry an electrode has, the larger the flexibility of the beam optical component to perform to a desired beam optical performance for different applications. In particular, if more than one electrode of the beam optical component have multiple openings of different geometries, the number of possible opening combinations increases rapidly. In any case, a skilled person will know how many openings the multiple openings of an electrode should have and what shape and of material they should be made in order to meet desired performances.

Further, in the case that electrode 5 with the multiple openings 7a, 7b, 7c is positioned to define a beam aperture, the multiple openings of electrode 5 may be used to determine the beam intensity and spatial resolution. For example, by moving large opening 7a into the charged particle beam 3, the intensity of the charged particle beam is high but the spot is large. Vice versa, by moving a small opening 7b into the charged particle beam 3, intensity of the charged particle beam is low but the spot can be made smaller. Therefore, with the driving means and electrodes having multiple openings, the beam optical component can provide a flexibility that makes a charged particle beam device usable for many different fields of applications.

Further, in the case that at least two of the multiple openings 7a, 7b of electrode 5 have the same size, a replacement of an active opening by another opening of the same size by driving means 13 can be used to replace a worn out opening 7a, 7b by a new opening 7a, 7b. Openings that are used as a beam apertures tend to wear out due to intense exposure to the charged particle beam. For example, in an electron beam device, electron beam exposure may lead to a contamination of the opening rim that may narrow the opening size. In an ion beam device, in contrast, ion beam exposure may lead to an increased opening size due to the ion beam sputtering effect that takes away material from the opening rim. In both cases, a regular replacement of one opening by a new one of the same size provides that the aperture angle remains more stable.

Figure 8A:
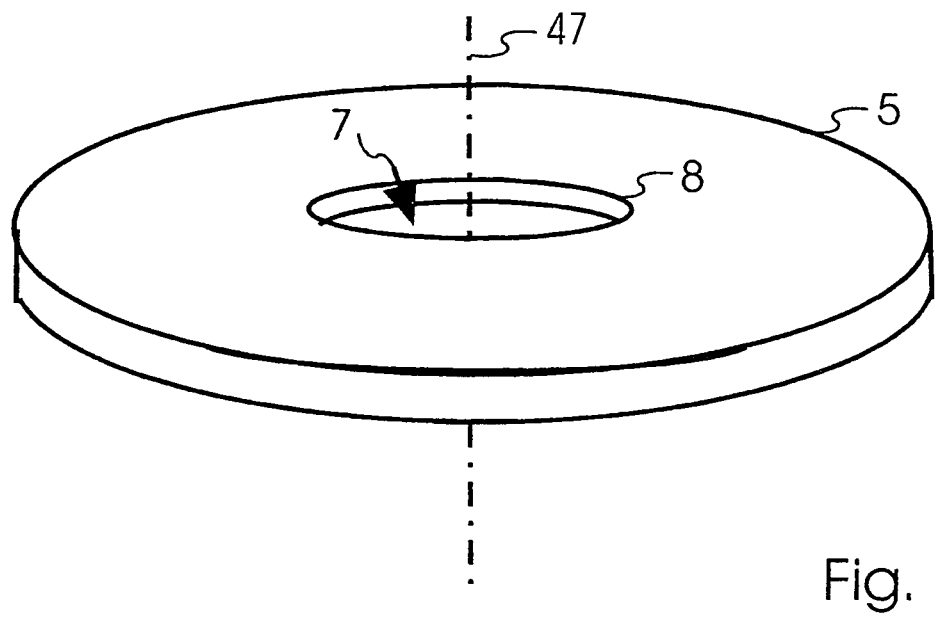
FIG. 8a-b First electrode of a charged particle lens having a (a) a circular opening and (b) a rectangular opening.
Figure 8B:
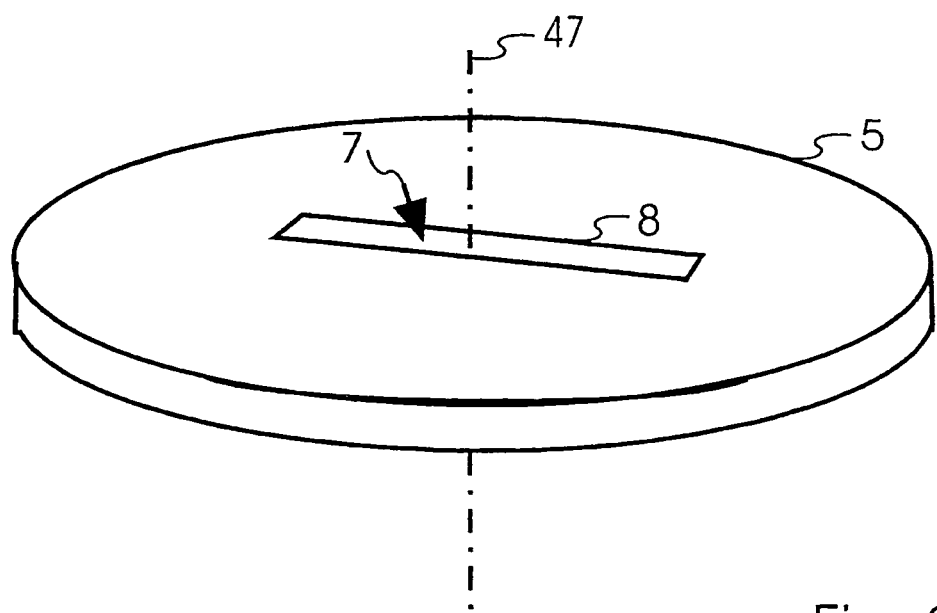

FIG. 8a-b illustrate two kinds of electrodes 5 that can be used for the beam optical component of the present invention. In FIG. 8a, electrode 5 has a circular opening 7 to provide a rotationally symmetric focus. Central axis 47 of electrode 5 is defined by the symmetry axis of opening 7.

In FIG. 8b, in contrast, electrode 5 has a rectangular opening 7 to provide a slit-like focus in only one dimension. Central axis 47 of electrode 5 of FIG. 7b is defined by the center of opening 7.

FIG. 9a illustrates an ninth embodiment according to the invention. In this case, the charged particle lens 1 is identical to the one shown in FIG. 3 with the differences being: (a) that first driving means 13 provide for moving first electrode 5 in x- and y-direction but not in z-direction, (b) that first measuring means 30 provide for measuring the position of first electrode 5 in x- and y-direction but not in z-direction, and (c) that there are second driving means 42 connected to first and second electrodes 5, 9 that have three z-drives 13z to adjust the parallelism of the first electrode 5 with respect to the second and third electrodes 7, 25. FIG. 9b illustrates, as an example, possible positions of the three z-drives 13z with respect to second electrode 9 and its opening 11. By positioning three z-drives 13z at three different locations between the first and second electrodes 5, 9, it is possible to define the orientation of the first electrode 5 with the second electrode 9 with a high precision with respect to all three spatial axes. This way, a high degree of parallelism can be obtained.

Note that taking three z-drives 13z at three different positions for a parallel alignment of adjacent electrodes is useful since it enables a three axis alignment to obtain a parallel orientation. In principle, however, it is also possible to use only two z-drives 13z at two different positions for a triple axis alignment if there is a distance element that keeps the distance between the adjacent electrodes fixed at a third position.

Figure 10A:
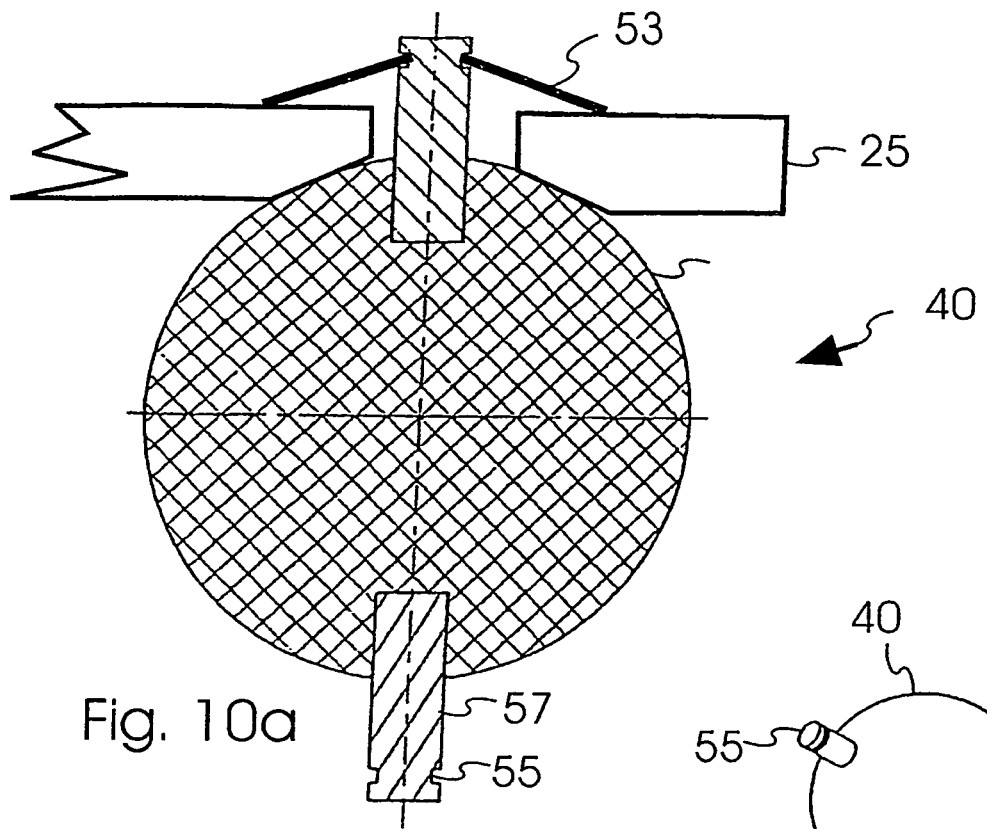
FIG. 10a-c Elements for positioning the first element with respect to the second element of a charged particle lens.
Figure 10B:
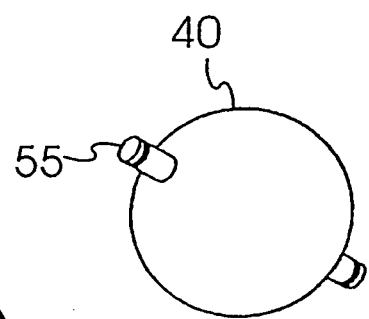
Figure 10C:
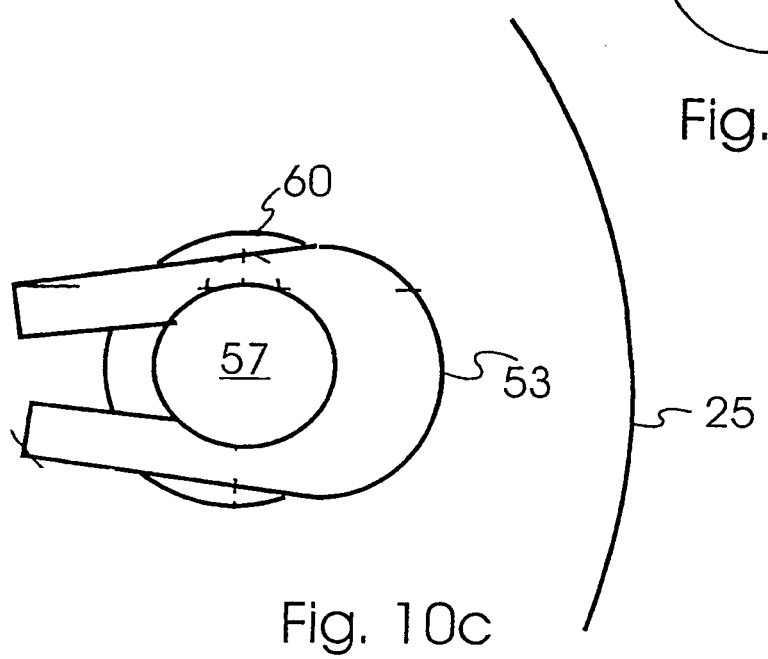

FIG. 10a-c illustrate a way in which adjacent electrodes 5, 9 of a charged particle lens 1 can be aligned with respect to each other with high precision when no driving means are used. This alignment has already been mentioned when referring to the spherical distance pieces 40 of FIGS. 3 and 5-7.

FIGS. 10a-c disclose different views on the spherically shaped distance piece 40 having two notched pins 57, i.e. a pin having a notch 55 engraved. Notched pins 57 are attached to spherically shaped distance piece 40 by, e.g., gluing or brazing. As can be seen from FIG. 10a-c, notched pins 57 are used to abut third electrode 25 to the spherically shaped distance piece 40 by means of a spring 53 inserted into notch 57 under the pressure exerted by third electrode 25 onto spring 53. This way, third electrode 25 is pushed down onto spherically shaped distance piece 40 at a pressure that is essentially given by the type of spring. FIG. 10c depicts notched pin 57 with spring 53 in more detail when viewed from the top.

In the same way, it is possible to abut a second electrode of the charged particle lens 1 to the spherically shaped distance piece 40 on the opposite side of the sphere, i.e. where the other notched pin 57 is fastened. Due to the high geometrical precision of the spheres, and by using at least three spherically shaped distance pieces 40 to abut two electrodes to the respective spheres, it is possible to align the two adjacent electrodes to each other at high precision without having to glue the electrodes to each other. The use of spheres for aligning adjacent electrodes has been described originally by S. Planck and R. Spehr in "*Construction and fabrication of electrostatic field lenses for the SMART project*" in the Annual Report 1996/1997 of "Licht- und Teilchenoptik", Institut für angewandte Physik, Technische Unversität Darmstadt, Prof. Dr. Theo Tschudi on page 114.

The present design for aligning two adjacent electrodes is improved over the design of S. Planck and R. Spehr in that, in addition to a first electrode 5 having a first opening 7, a second electrode 9 having a second opening 11, and at least one spherical distance piece 40 positioned between said first electrode 5 and said at least second electrode 9 to provide for a minimum distance between said first electrode 5 and said second element 9, the beam optical component also includes a first holding piece, e.g. notched pin 57 with the spring 53, that is attached to said spherical distance piece 40. With the first holding piece 53, 57 attached to the at least one distance piece, the first electrode 5 can be held to the at least one spherical distance piece 40 at the point of mechanical support defined by the position of the spherical distance piece 40. Therefore, the pressure exerted by the first holding piece 53, 57 onto the first electrode 5 can be counteracted by the spherical distance piece 40 at the position where the first holding piece 53, 57 exerts its force onto the first electrode 5. This eliminates distorting or tilting forces onto the first electrode 5 which otherwise would deteriorate the quality of focussing a charged particle beam.

The spherically shaped distance pieces 40 are preferably made of $Al_2O_3$. The fabrication of spheres with a geometric precision of typically 1 micrometer, made out of materials like $Al_2O_3$, is well known in the art. The diameters of the spheres can be chosen quite freely. For applications in charged particle beam devices, the spheres have typically a diameter between 1 mm to 100 mm. For applications in high energy beams, the diameter of the spheres may even have to exceed 100 mm in order to withstand the high voltages between the electrodes that are required by such high energy.

Spherically shaped distance pieces 40 of the kind as shown in FIGS. 10a-c may also be fabricated from materials other than $Al_2O_3$, under the conditions that (a) the material is electrically insulating, (b) the material can be shaped to a sphere with a high geometric precision and (c) the material is hard enough to withstand the pressure exerted by an electrode that is pressed onto the sphere by a respective holding piece. For example, the spherically shaped distance piece 40 may be made of materials like insulating ceramics, glass, sapphire etc.

The notched pins 57 in FIG. 10a-c are made of, e.g. stainless steel or, for brazing the pins into a spherically shaped distance piece, titanium or Vacon™. However, other electrically conducting or non-conducting materials can be used as well. In FIG. 10a-c, the notched pins 57 are attached to the spherically shaped distance piece 40 by gluing. To do this, two holes are drilled into the spherically shaped distance piece 40 on opposite sides along a same axis of the sphere. Then, the two notched pins 57 are each inserted into the respective holes after some glue has been filled into the holes.

The beam optical components disclosed in this description are only specific non-limiting examples to describe one of many ways in which driving means connected to elements like electrodes or pole pieces can be used to improve the focussing quality, beam current control and spatial resolution of beam optical components. A person skilled in the art knows how to combine the various embodiments according to the invention, and how to adjust the embodiments in order to meet special requirements for other given beam focussing application. Those combinations and adjusted embodiments are within the scope of the present invention.

The invention claimed is:

1. A beam optical component comprising a charged particle lens for focusing a charged particle beam, the charged particle lens comprising:
 a first electrode having a first opening defining a first space through which the charged particle beam can propagate;
 a second electrode having a second opening defining a second space through which the charged particle beam can propagate; and
 first driving means coupled to at least one out of the first electrode and the second electrode for aligning the first opening with respect to the second opening;
 wherein the first and the second electrodes are separated by a distance;
 whereby at least one out of the first and second electrodes is shaped to comprise multiple openings for focusing the charged particle beam, and wherein the multiple openings of an electrode may be replaced by each other without breaking vacuum, whereby the multiple openings replace one another as an active opening that is in line with the charged particle beam.

2. The beam optical component according to claim 1, whereby the charged particle lens comprises a third element having a third opening for focusing the charged particle beam.

3. The beam optical component according to claim 2, whereby the geometry of the first, second or third opening defines a respective first, second or third central axis.

4. The beam optical component according to claim 3, whereby the first driving means are capable of aligning the first and second central axes to a common symmetry axis.

5. The beam optical component according to claim 1, whereby the first driving means are capable of aligning the first and second electrodes to be coaxially or parallel aligned.

6. The beam optical component according to claim 3, whereby the charged particle lens comprises second driving means coupled to at least one of the second electrode and the third element for aligning the second opening with respect to the third opening.

7. The beam optical component according to claim 6, whereby the second driving means are capable of aligning the second and third central axes to a common symmetry axis.

8. The beam optical component according to claim 1, comprising a charged particle beam source.

9. The beam optical component according to claim 8, whereby the charged particle beam source comprises an extracting electrode for extracting charged particles into a vacuum.

10. The beam optical component according to claim 2, whereby the third element is an electrode for focusing the charged particle beam.

11. The beam optical component according to claim 10, whereby the third electrode is positioned such as to serve as an extracting electrode.

12. The beam optical component according to claim 8, whereby at least one out of the first and second electrodes and third element or electrode is shaped and positioned with respect to the charged particle beam source to serve as a beam aperture for the charged particle beam.

13. The beam optical component according to claim 6, whereby at least one out of the first and second driving means is capable of moving the respective first or second electrode in a first direction laterally to their respective first or second central axes.

14. The beam optical component according to claim 13, whereby at least one out of the first and second driving means is capable of moving the respective first or second electrode in a second direction perpendicular to the respective first or second central axis and, preferably, perpendicular to the first direction.

15. The beam optical component according to claim 6, whereby at least one out of the first and second driving means is capable of moving the respective first or second electrode into the directions of the respective first or second central axis.

16. The beam optical component according to claim 6, whereby at least one out of the first and second driving means is capable of moving the respective first or second electrode at a spatial resolution of better than 10 micrometers, preferably better than 1 micrometer and even more preferred of better than 100 nm.

17. The beam optical component according to claim 2, whereby the charged particle lens comprises first and second measuring means to measure the actual location of the respective first or second opening with respect to the second or third opening.

18. The beam optical component according to claim 17, whereby the charged particle lens comprises electronic connections between at least one out of the first and second measuring means and the respective first or second driving means for feeding information of the measured location of the first or second opening to the first or second driving means to adjust the actual location to a desired location.

19. The beam optical component according to claim 18, whereby at least one out of the first and second driving means are remotely controllable.

20. The beam optical component according to claim 19, whereby at least one out of the first and second driving means comprises a precision motor drive, a stepping motor, a DC-motor, or a piezo-motor.

21. A beam optical component comprising a charged particle lens for focusing a charged particle beam, the charged particle lens comprising:
a first electrode having a first opening defining a first space through which the charged particle beam can propagate;
a second electrode having a second opening defining a second space through which the charged particle beam can propagate; and
first driving means coupled to at least one out of the first electrode and the second electrode for aligning the first opening with respect to the second opening;
wherein the first and the second electrodes are separated by a distance;
whereby at least one out of the first and second electrodes is shaped to comprise multiple openings for focusing the charged particle beam, whereby at least one out of the first and second electrodes is shaped and positioned to provide that the distance of at least one of the multiple openings to an opening of an adjacent electrode in axial direction is larger by at least ten percent compared to the distance in axial direction of at least one of the other of the multiple openings to said opening.

22. The beam optical component according to claim 21, whereby at least one out of the first and second electrodes is shaped such that a thickness of the rim of at least one of the multiple openings is larger by at least a factor of two compared to a thickness of the rim of at least one of the other multiple openings of said adjacent electrode.

23. The beam optical component according to claim 21, whereby at least two of the multiple openings of the first or second electrode have essentially the same size.

24. The beam optical component according to claim 2, whereby at least one out of the first, second and third openings is rotationally symmetric with respect to its central axes.

25. The beam optical component according to claim 24, whereby at least one out of the first, second and third openings is rectangularly shaped.

26. The beam optical component according to claim 2, whereby the charged particle lens comprises at least one distance piece between the second electrode and the third element to provide for a minimum distance between said second electrode and said third element.

27. The beam optical component according to claim 26, whereby the charged particle lens comprises at least one holding piece for abutting the second electrode to the at least one distance piece, whereby the first holding piece is attached to the at least one distance piece.

28. The beam optical component according to claim 27, whereby the distance piece is spherical.

29. The beam optical component according to claim 6, whereby the first or second driving means are connected to at least two of the first and second electrodes and third element.

30. The beam optical component according to claim 21, whereby the charged particle lens comprises more than three elements or electrodes that each have an opening for focusing the charged particle beam.

31. The beam optical component according to claim 30, whereby the charged particle lens comprises more than two driving means that are connected with the third element or one of the more than three elements.

32. The beam optical component according to claim 2, whereby at least one out of the first and second openings is smaller than the third opening by a factor of two, preferably by a factor of ten and even more preferred by a factor of 50.

33. A charged particle beam device for focusing a charged particle beam onto a specimen, comprising a beam optical component according to claim 1.

34. The charged particle beam device according to claim 33, comprising in addition:
a specimen holder to hold the specimen for inspecting or structuring the specimen; and
a beam aperture to limit the aperture angle of the charged particle beam for inspecting or structuring the specimen.

35. The charged particle beam device according to claim 34 whereby the beam optical component is positioned between the specimen holder and the beam aperture to focus the charged particle beam onto the specimen.

36. The charged particle beam device according to claim 33 comprising an objective lens and a charged particle beam source.

37. The charged particle beam device according to claim 36 whereby the beam optical component is positioned between the objective lens and the charged particle beam source.

38. Method of aligning a first opening of a first element with respect to a second opening of a second element for focusing a charged particle beam onto a specimen, comprising:
- providing a beam optical component according to claim 1;
- first scanning the charged particle beam across the specimen to generate a first image of the specimen with a first set of voltages applied to the first electrode and the second electrode of the beam optical component;
- second scanning the charged particle beam across the specimen to generate a second image of the specimen with a second set of voltages applied to at least one out of the first electrode and the second electrode of the beam optical component;
- moving the first electrode with respect to the second electrode; and
- repeating the second scanning the charged particle beam until at least one structure element of the specimen identified in the first image is identified in the second image.

39. The method according to claim 38 comprising moving the second electrode with respect to a third element until at least one structure element of the specimen identified in the first image is identified in the second image.

40. The method according to claim 38 whereby the first set of voltages and the second set of voltages are the same for at least one of the first, second and third elements.

41. The method according to claim 38, whereby a charged particle beam is generated by the charged particle beam device.

* * * * *